(12) United States Patent
Guo et al.

(10) Patent No.: US 9,842,749 B2
(45) Date of Patent: Dec. 12, 2017

(54) PLASMA ASSISTED METHOD OF ACCURATE ALIGNMENT AND PRE-BONDING FOR MICROSTRUCTURE INCLUDING GLASS OR QUARTZ CHIP

(71) Applicant: Beijing University of Technology, Beijing (CN)

(72) Inventors: Guangsheng Guo, Beijing (CN); Siyu Wang, Beijing (CN); Qiaosheng Pu, Beijing (CN); Xiayan Wang, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 15/324,670

(22) PCT Filed: Nov. 17, 2015

(86) PCT No.: PCT/CN2015/094796
§ 371 (c)(1),
(2) Date: Jan. 6, 2017

(87) PCT Pub. No.: WO2017/045264
PCT Pub. Date: Mar. 23, 2017

(65) Prior Publication Data
US 2017/0301564 A1 Oct. 19, 2017

(30) Foreign Application Priority Data

Sep. 18, 2015 (CN) .......................... 2015 1 0598724

(51) Int. Cl.
*H01L 21/26* (2006.01)
*H01L 21/67* (2006.01)
(Continued)

(52) U.S. Cl.
CPC .... *H01L 21/67028* (2013.01); *B81C 1/00928* (2013.01); *B81C 3/001* (2013.01);
(Continued)

(58) Field of Classification Search
CPC ............... H01L 21/67028; B81C 3/002; B81C 1/00928; B81C 2201/0128;
(Continued)

(56) References Cited

U.S. PATENT DOCUMENTS 8,236,626 B2 * 8/2012 Dai ........................ B82Y 30/00
257/E21.051
2003/0227664 A1 * 12/2003 Agrawal ............... G02F 1/1523
359/269

FOREIGN PATENT DOCUMENTS

CN 1588617 A 2/2005
CN 101000290 A 7/2007

OTHER PUBLICATIONS

Jia Zhijian Studies on Fabrication and Sample Introduction Techniques for Microfluidic Chips CNKI, Aug. 31, 2005 Engineering Technology I p. B014-103.
(Continued)

*Primary Examiner* — Long K Tran

(57) ABSTRACT

The plasma-assisted method of precise alignment and pre-bonding for microstructure of glass and quartz microchip belongs to micromachining and bonding technologies of the microchip. The steps of which are as follows: photoresist and chromium layers on glass or quartz microchip are completely removed followed by sufficient cleaning of the surface with nonionic surfactant and quantities of ultra-pure water. Then the surface treatment is proceeded for an equipping surface with high hydrophily with the usage of plasma cleaning device. Under the drying condition, the precise alignment is accomplished through moving substrate and cover plate after being washed with the help of micro-
(Continued)

scope observation. Further on, to achieve precise alignment and pre-bonding of the microstructure of glass and quartz microchip, a minute quantity of ultrapure water is instilled into a limbic crevice for adhesion, and entire water is completely wiped out by vacuum drying following sufficient squeezing. Based on the steps above, it is available to achieve permanent bonding by further adopting thermal bonding method. In summary, it takes within 30 min to finish the whole operation of precise alignment and pre-bonding by this method. Besides, this method is of great promise because of its speediness, efficiency, easy maneuverability, operational safety and wide applications.

9 Claims, 3 Drawing Sheets

(51) Int. Cl.
*B81C 3/00* (2006.01)
*B81C 1/00* (2006.01)

(52) U.S. Cl.
CPC ...... *B81C 3/002* (2013.01); *B81C 2201/0102* (2013.01); *B81C 2201/019* (2013.01); *B81C 2201/0128* (2013.01); *B81C 2201/0133* (2013.01)

(58) Field of Classification Search
CPC ...... B81C 2201/0102; B81C 2201/019; B81C 2201/0133
USPC .......................... 257/797; 438/401, 462, 975
See application file for complete search history.

(56) References Cited

OTHER PUBLICATIONS

MMR, Howlader, Room temperature wafer level glass/glass bonding, Sensors and Actuators A Dec. 19, 2005 127(2006) ISSN:0924-4247 p. 31-36.

* cited by examiner

PLASMA ASSISTED METHOD OF ACCURATE ALIGNMENT AND PRE-BONDING FOR MICROSTRUCTURE INCLUDING GLASS OR QUARTZ CHIP

CROSS REFERENCE TO RELATED APPLICATION

This application is a national stage application of International application number PCT/CN2015/094796, filed Nov. 17, 2015, titled "Plasma assisted method of accurate alignment and pre-bonding for microstructure including glass or quartz chip," which claims the priority benefit of Chinese Patent Application No. 201510598724.5, filed on Sep. 18, 2015, which is hereby incorporated by reference in its entirety.

TECHNICAL FIELD

Embodiments of this disclosure include a method of precise alignment and pre-bonding for glass or quartz microchips. By using this method, the simple and fast pre-bonding of microchips is realized, the usage of dangerous washing reagents is avoided, the success rate of thermal bonding of glass and quartz microchip is improved dramatically, and the permanent bonding of microchips is obtained. On the other side, the as-manufactured microchips can be used in the chemical and biological analysis, etc. Above all, this disclosure belongs to the technology of microchip micromachining and bonding.

BACKGROUND

In the 1990s, miniaturized total analysis systems or Lab-on-a-chip were firstly proposed by Manz and Widmer. Because of its high analytical efficiency and low reagent consumption, micro-miniaturization and integration of analytical devices, and advantages of high throughput analysis of various kinds of materials, they have become one of the research hotspots in the analytical chemistry field. Common materials used for manufacturing microchips include glass, quartz, and high molecular polymer, among which glass and quartz are the most common used materials for manufacturing microchips due to its excellent optical and electro-osmosis performance. Meanwhile, with the fast development of glass process industrial, various kinds of glass have been made to be chosen as suitable glass substrate per research objects. Microchip fabrication mainly includes micromachining and bonding; however, bonding has become key and challenging points in microchips fabrication owing to its low success rate. Quartz is extremely noted for the problem of low bonding efficiency when used for microchips fabrication. Currently, the techniques needed for current bonding method include superficial rinse of glass or quartz microchips and conducting bonding by way of exerting certain pressure and heat. Usually, dangerous Piranha solution which consists of concentrated sulfur acid ($H_2SO_4$) and hydrogen peroxide ($H_2O_2$) mixed in proportion is used for cleaning. Commonly the dangerous Piranha solution is used under the boiling state for the purpose of best superficial and activation effect. However, it dramatically decreases manufacturing efficiency owing to severe security hazard and time-consuming treating process. One of the frequently-used means for pre-bonding after rinse is evaporation of water in a tunnel and inter-chip after alignment in water. Thus, permanent bonding is obtained. It is found in researches that extremely low success rate of single alignment is generated by the existence of surface affinity between substrate and cover plate and water surface tension. Additionally, because of the high percentage of water, a minute amount of water in inter-chip may gasify rapidly in case of insufficient evaporation during thermal bonding in a high-temperature furnace, which inevitably leads to microchips bursting. Particularly, superficial defect from microhole on the etched surface of microchips can be created by unavoided etching at pin hole which possibly exists in photoresist without the protection of sacrificial layer. Moreover, the possibility of bursting during thermal bonding can also be increased for the existence of remaining water and bubbles in between micro-holes. Meanwhile, a few bubbles in between microchips would cause incomplete bonding in partial restrict which results in interferometric fringe and an apparent decrease in bonding intensely. Another alternative way for alignment and permanent thermal bonding is to perform operations following the step of Piranha solution washing in drying circumstances. It remains difficult to align with low success rate even adopting special assistant alignment instruments, the reason of which lies in the fact that substrate and cover plate after being washed by Piranha are highly possible to fit closely, bringing the alignment harder. Thus it can be seen that the obstacles result in low yield and efficiency of bonding of glass or quartz microchips, and an efficient, fast and safety pre-bonding method is needed.

SUMMARY

The aim of this disclosure is directed to overcome current technical problems and put forward a plasma-assisted method of precise alignment and pre-bonding for microstructure of glass or quartz microchip. The high hydrophilic surface, playing an assistant role in the following alignment and pre-bonding of microstructure of microchips, is formed because of superficial cleaning and activation of substrate and cover plate performed by plasma cleaning device to replace original protective layer on surface of glass or quartz microchips, which are manufactured by wet etching or other micromachining method. Under a drying condition, flexible movement of substrate and cover plate can be achieved by which precise alignment is obtained with microscope observation. After installation of the microliter-degree amount of ultra-pure water into the limbic crevice, the fitness of both microchips is realized under hydrophilic interaction through capillary penetration. Following sufficient squeezing out the extra water, pre-bonding of glass or quartz microchips are carried out by complete removal of water in microchips with vacuum drying. A further step of permanent bonding is accomplished using thermal bonding approach. The method proposed by this disclosure not only avoids using Piranha solution and increase safety factor during practice but also simplifies the operational process and save possible cost, contents of which is to perform rinse and activation on glass or quartz materials by using plasma device. The substrate and cover plate can move flexibly after being washed by plasma, which is beneficial for precise alignment of substrate and cover plate using microscope under drying condition. It solves the problem of not only the low success rate of wet alignment but also the difficult alignment caused by the easy fitness of substrate and cover plate after being washed by Piranha. Vacuum treatment after microchip fitting with a minute amount of water contributes to complete evaporation of water, which avoids the problem of microchip burst during thermal bonding. The method proposed in this disclosure realizes precise alignment and pre-bonding of the microstructure of glass or quartz microchips with the assistance of plasma, the total time of which is within 30 min ended in the realization of fast, efficient and safety process of glass or quartz microchip manufacturing. Using the method mentioned in this disclosure to treat glass or quartz microchips, the success rate of further thermal bonding basically, reaches 100%. Even more noteworthy is that the method mentioned in this disclosure can be applied to not merely different kinds of glass and quartz materials, but also a different type of microchips fabrication like a micro-fluid microchip, indicating a promise application prospect.

To satisfy the objectives mentioned above, the technical proposal of this disclosure includes steps as follows: a plasma-assisted precise alignment of microstructure and pre-bonding method for glass and quartz microchip fabrication may include the following steps:

1) before removing the superficial photoresist and chromium layers, microstructure machining is undertaken on substrate and cover plate of glass or quartz microchips by wet etching or another method of micromachining;
2) superficial organics, solid, particulates, and dust are wiped out by quantities of ultra-water cleaning following step of nonionic surfactant cleaning of substrate and cover plate;
3) after blow-dry or spin-dry, the surface of substrate and cover plate are equipped with high hydrophily through rinse and activation by using plasma cleaning device;
4) quick and rough alignment of substrate and cover plate are accomplished by fitting two microchips;
5) under drying condition, the precise alignment of two adhesive microchips is done under microscope observation; then, minute quantity of ultrapure water are instilled into limbic crevice for adhesion; furthermore, it is the formation of hydration shell on highly hydrophilic surface of substrate and cover plate after plasma cleaning that makes two microchips fitting tightly;
6) water is wiped out in the way of pressuring adhesive glass or quartz microchips to squeeze out spare water in tunnel followed by using gas to blow off limbic water; and
7) water in the tunnel are completely removed by vacuum drying which symbolizes the end of pre-bonding steps.

Substrates used in step 1) include but are not limited to various kinds of glass or quartz materials.

In step 3), the time for exterior cleaning and activation of substrate and cover plate by usage of plasma cleaning device is 3-10 minutes; gas for stimulating plasma include but are not limited to air, nitrogen, and oxygen.

In step 4), fulfillment of rough alignment is carried out through flexible movement of substrate and cover plate by unaided viewing; in step 5); the accomplishment of precise alignment of microchips are done in the way of moving cover plate on fixing substrate simultaneously with the help of a microscope or another observational instrument.

In step 5), the volume of ultrapure water instilled into a limbic crevice for adhesion is 2-7 µL; besides, it is the great hydrophily of the inner surface of substrate and cover plate after treatment by plasma that makes two microchips fitting tightly in a capillary penetration approach.

Blow-dry in gas or spin-dry method are adopted in removal of superficial water on microchips;

In step 7), the time for vacuum treatment on microchips by ways of vacuum drying oven or vacuum function of plasma cleaning device is 5-20 min; also, the settlement at room temperature can also be adopted to obtain the same effect, the time for which is 1-24 h.

The total operation time for fulfillment of precise alignment and pre-bonding is 20-35 min.

Permanent bonding of microchips is realized via high-temperature processing onto pre-bonded glass or quartz microchips in muffle furnace following the preset heating procedure.

The rate of the heating procedure is 1-3° C./min; initial temperature: room temperature; maximum temperature: 550° C.-1200° C.; temperature holding time: 1-3 h; cooling rate: 0.5-5.5/min; and final temperature: room temperature.

Further thermal bonding is applied to glass or quartz pre-bonded microchips which are synthesized by a method in this disclosure:

Permanent bonding of microchips is realized via high-temperature processing onto S1 pre-bonded glass or quartz microchips in muffle furnace following the preset heating procedure.

The rate of the heating procedure is 1-3° C./min; initial temperature: room temperature; maximum temperature: 550° C.-1200° C.; temperature holding time: 1-3 h; cooling rate: 0.5-5.5° C./min; final temperature: room temperature.

The effects obtained from this disclosure are as follows.

During the process of washing and activation of glass or quartz substrate and cover plate after etching, Piranha solution is no longer needed which obviously simplifies the alignment, it not only saves preparation time of Piranha solution and soaking time of substrate and cover plate but also prevent severe potential security hazard from dangerous Piranha. Moreover, the high hydrophilic surface, formed because of exterior cleaning and activation of substrate and cover plate performed by plasma cleaning device, provides highly facilitated conditions for the next alignment and pre-bonding of the microstructure of microchips. Rough and precise alignments are conducted after plasma rinse based on the flexible moving ability of substrate and cover plate during the alignment process. This flexible moving ability not only solves problems of the low success rate of wet etching and insufficient bonding caused by the existence of trace amount of bubble in water but also settled fail alignment brought from big trends of partial tight fitting owing to the process of Piranha solution cleaning. The easy, fast and efficient alignment can be achieved within 5-10 min because of the flexible moving ability of microchips processed using this method. Due to the high hydrophily of microchips inner surface, a minute amount of water in a limbic crevice can diffuse rapidly into microchips for pre-bonding. The vacuum drying process for removing all water in between microchips can be completed with 5-10 min on account of the small amount of water, the advantages of which lies in both high efficiencies of water evaporation and full usage of multiple functions of plasma cleaning device. Less than 7 µL water used in the whole pre-bonding process can be rapidly and comprehensively evaporated by vacuum drying without the problem of microchips burst which is likely to be caused by high-temperature rapid gasify of a little water in between microchips during the thermal bonding process of a wet etching method. Meanwhile, intensity and success rate of bonding are dramatically improved when Newton rings and other interference fringe caused by remaining bubbles and impurities in water are efficiently avoided. Particularly, microchips burst during a further step of thermal bonding may also be due to evaporation of remaining water existing in micro-holes which come from the possible etching of salt existed pinholes in non-channel position on the surface of microchips owing to the removal of chromium sacrificial layers. By using the method proposed by this disclosure to finish pre-bonding of glass or quartz microchips, a superficial defect like micro-holes is avoided. In summary, plasma-assisted precise alignment and pre-bonding method for microstructure of microchips of different types of glass or quartz materials can be accomplished within 30 min compared to a couple of hours or days in the traditional approach. Besides, the success rate of thermal bonding when using this method almost attained 100%. Taking all these advantages above into account, this disclosure is a fast, simple, safety and efficient way of pre-bonding suitable for sorts of glass or quartz microchips with high promise of application.

DETAILED DESCRIPTION OF THE PREFERRED EMBODIMENTS

The disclosure is further illustrated in more details accompanied by specification with attached maps and concrete examples so that researchers in the related field can better understand this disclosure scheme. However, this disclosure is not limited to the following examples.

Example 1

S1 Plasma-Assisted Precise Alignment and Pre-Bonding for Microstructure of Soda Glass Substrate Microchip:

1) After wet etching, 2.3 mm thick optical cement on the surface of soda glass substrate microchip is dissolved with acetone, and then sufficiently washed with isopropyl alcohol and large quantities of water successively. Thirdly, the complete removal of chromium is carried out through putting glass substrate into decarbonisation solution which consists of ammonium ceric nitrate, acetic acid, and ultra-pure water.

2) Superficial organics, solid particulates and dust on soda glass substrate and cover plate are wiped off by sufficient liquid detergent and quantities of ultra-pure water.

3) After blow-drying most water with a high-pressure air rifle, exterior cleaning, and activation which lasts for 3-10 min are processed in plasma cleaning device which is stimulated by air. A device used in this process is plasma cleaning device in the version of PLASMA CLEANER PDC-002 manufactured by HARRICK PLASMA cooperation.

4) A rough alignment is finished via adjusting angle and direction while fitting substrate and cover plate which are cleaned and activated by plasma.

5) Under drying condition, precise alignment is accomplished in the way of moving substrate on fixed cover plate under microscope observation. After alignment, an appropriate amount of ultra-pure water is added based on the size of microchips. When the size of soda glass microchips is 6.2 cm×4.2 cm×4.6 mm, 2 µL ultrapure water is dropped into the limbic crevice. Because of the high hydrophily on the inner surface of substrate and cover plate obtained by plasma treatment, tight fitting of microchips is fulfilled via water drop capillary penetration.

Figure 1:
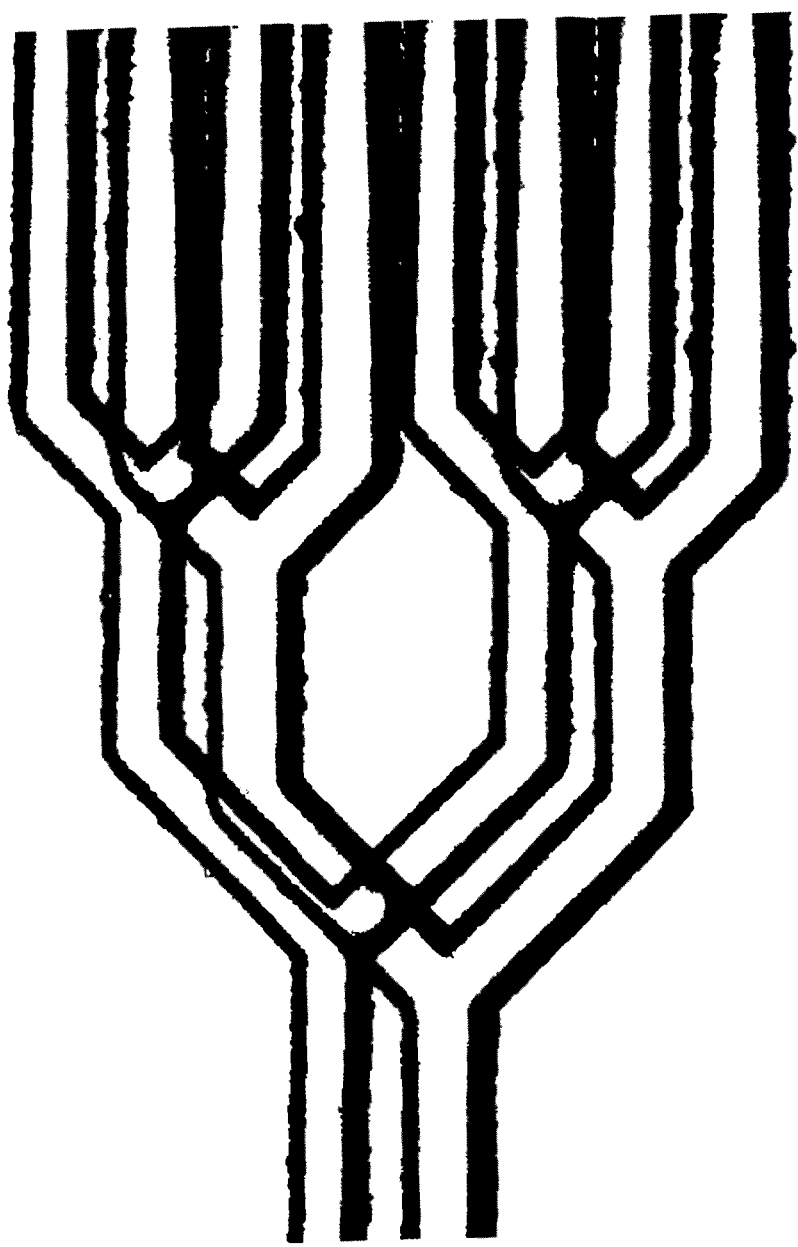
FIG. 1 is a photograph of the microstructure of soda glass substrate microchip before precise alignment in this disclosure.
Figure 2:
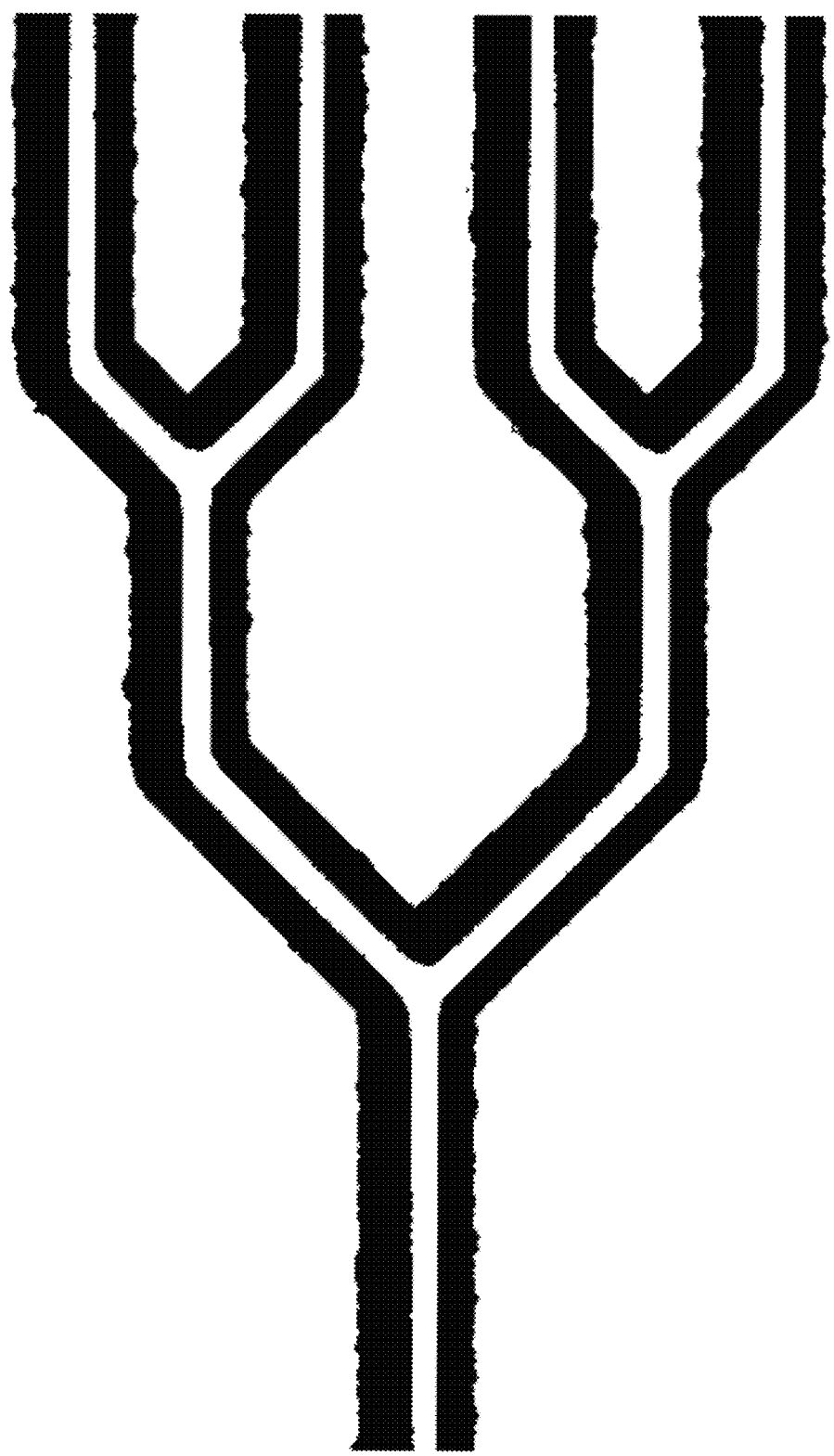
FIG. 2 is a photograph of the microstructure of soda glass substrate microchip after precise alignment in this disclosure.

FIG. 1 is a photograph of the microstructure of soda glass substrate microchip before precise alignment in this disclosure. Subtle positional deviation in micro-channel remains after rough alignment. FIG. 2 is a photograph of the microstructure of soda glass substrate microchip after precise alignment in this disclosure. It can be inferred from comparing FIG. 1 and FIG. 2 that rough alignment after plasma cleaning is for the sake of adjustment of channel angle and direction; and then the precise alignment of micro-channel can be realized in the way of moving cover plate on fixed substrate under microscope observation, providing a powerful guarantee for microchips efficient utilization.

6) Soda glass substrate microchips after fitting are pressured to squeeze out extra water in the tunnel. Observation of interference fringe is needed; if there is one, step 1) to 5) should be repeated; if there is none, high-pressure air rifle is adopted to blow-dry limbic water.

7) Vacuum drying relying on the vacuum function of plasma cleaning device is performed on soda glass substrate microchips for 5-20 min to totally wipe out water in the channel and finish the pre-bonding process in the end. A device used in this process is plasma cleaning device in the version of PLASMA CLEANER PDC-002 manufactured by HARRICK PLASMA cooperation.

S2 Thermal Bonding of Soda Glass Substrate Microchip:

Permanent bonding of microchips is realized via high-temperature thermal bonding of the pre-bonded soda glass substrate microchips in muffle furnace following the preset heating procedure. That is: room temperature is set as initial temperature; the maximum temperature of 550° C. is reached at a heating rate of 1-3° C./min; the temperature is held at 550° C. for 1-3 h; and the final room temperature is reached at a cooling rate of 0.5-5.5° C./min.

Figure 3:
FIG. 3 is an effect picture of a cross section of soda glass substrate microchip after thermal bonding in this disclosure.

FIG. 3 is an effect picture of a cross section of soda glass substrate microchip after thermal bonding in this disclosure. The central position is edge-closed channels including a microstructure on a substrate and cover plate.

FIG. 3 indicates no boundary between the substrate and cover plates as a result of a completely integrated whole transformed from 2.3 mm thick microchips before thermal bonding.

Example 2

S1 Plasma-Assisted Precise Alignment and Pre-Bonding for Microstructure of Boron Glass Microchip:

1) After wet etching, 1.1 mm thick optical cement on the surface of boron glass substrate microchip is dissolved with acetone, and then sufficiently washed with isopropyl alcohol and large quantities of water successively. Thirdly, the complete removal of chromium is carried out through putting glass substrate into dechromisation solution which consists of ammonium ceric nitrate, acetic acid, and ultra-pure water.

2) Superficial organics, solid particulates and dust on boron glass substrate and cover plate are wiped off by sufficient liquid detergent and quantities of ultra-pure water.

3) After blow-drying most water with a high-pressure air rifle, exterior cleaning, and activation which lasts for 3-10 min are processed in plasma cleaning device which is stimulated by air. A device used in this process is plasma cleaning device in the version of PLASMA CLEANER PDC-002 manufactured by HARRICK PLASMA cooperation.

4) A rough alignment is finished via adjusting angle and direction while fitting substrate and cover plate which are cleaned and activated by plasma.

5) Under drying condition, precise alignment is accomplished in the way of moving substrate on fixed cover plate under microscope observation. After alignment, an appropriate amount of ultra-pure water is added based on the size of microchips. When the size of boron glass microchips is 6.2 cm×4.2 cm×4.6 mm, 2 μL ultrapure water is dropped into the limbic crevice. Because of the high hydrophily on the inner surface of substrate and cover plate obtained by plasma treatment, tight fitting of microchips is fulfilled via water drop capillary penetration.

6) Boron glass substrate microchips after fitting are pressured to squeeze out extra water in the tunnel. Observation of interference fringe is needed; if there is one, step 1) to 5) should be repeated; if there is none, a high-pressure air rifle is adopted to blow-dry limbic water.

7) Vacuum drying relying on the vacuum function of plasma cleaning device is performed on boron glass substrate microchips for 5-20 min to totally wipe out water in the channel and finish the pre-bonding process in the end. A device used in this process is plasma cleaning device in the version of PLASMA CLEANER PDC-002 manufactured by HARRICK PLASMA cooperation.

S2 Thermal Bonding of Boron Glass Substrate Microchip:

Permanent bonding of microchips is realized via high-temperature thermal bonding of the pre-bonded boron glass substrate microchips in muffle furnace following the preset heating procedure. That is: room temperature is set as initial temperature; the maximum temperature of 650° C. is reached at a heating rate of 1-3° C./min; the temperature is held at 650° C. for 1-3 h; and the final room temperature is reached at a cooling rate of 0.5-5.5° C./min.

The same thermal bonding effect as obtained by soda glass substrate microchips in Example 1 can also be achieved through thermal bonding performance on boron glass substrate microchips which are fabricated by the pre-bonding method proposed in this disclosure. The effect picture can be referred to FIG. 3.

Example 3

S1 Plasma-Assisted Precise Alignment and Pre-Bonding for Microstructure of Quartz Microchip:

1) After wet etching, 1.1 mm thick optical cement on the surface of quartz glass substrate microchip is dissolved with acetone, and then sufficiently washed with isopropyl alcohol and large quantities of water successively. Thirdly, the complete removal of chromium is carried out through putting glass substrate into dechromisation solution which consists of ammonium ceric nitrate, acetic acid, and ultra-pure water.

2) Superficial organics, solid particulates, and dust on substrate and cover plate of quartz are wiped off by sufficient liquid detergent and quantities of ultra-pure water.

3) After blow-drying most water with a high-pressure air rifle, exterior cleaning, and activation which lasts for 3-10 min are processed in plasma cleaning device which is stimulated by air. A device used in this process is plasma cleaning device in the version of PLASMA CLEANER PDC-002 manufactured by HARRICK PLASMA cooperation.

4) Rough alignment is finished via adjusting angle and direction while fitting substrate and cover plate which are cleaned and activated by plasma.

5) Under drying condition, precise alignment is accomplished in the way of moving substrate on fixed cover plate under microscope observation. After alignment, an appropriate amount of ultra-pure water is added based on the size of microchips. When the size of boron glass microchips is 6.2 cm×4.2 cm×4.6 mm, 2 μL ultrapure water is dropped into the limbic crevice. Because of the high hydrophily on the inner surface of substrate and cover plate obtained by plasma treatment, tight fitting of microchips is fulfilled via water drop capillary penetration.

6) Quartz substrate microchips after fitting are pressured to squeeze out extra water in the tunnel. Observation of interference fringe is needed, for if there is one, step 1) to 5) should be repeated, if there is none, a high-pressure air rifle is adopted to blow-dry limbic water.

7) Vacuum drying relying on the vacuum function of plasma cleaning device is performed on quartz substrate microchips for 5-20 min to totally wipe out water in the channel and finish the pre-bonding process in the end. A device used in this process is plasma cleaning device in the version of PLASMA CLEANER PDC-002 manufactured by HARRICK PLASMA cooperation.

S2 Thermal Bonding of Quartz Substrate Microchip:

Permanent bonding of microchips is realized via high-temperature thermal bonding of the pre-bonded quartz substrate microchips in muffle furnace following the preset heating procedure. That is: room temperature is set as initial temperature; the maximum temperature of 1100° C. is reached at a heating rate of 1-3° C./min; the temperature is held at 1100° C. for 1-3 h; the final room temperature is reached at a cooling rate of 0.5-5.5° C./min.

The same thermal bonding effect as obtained by soda glass substrate microchips in Example 1 can also be achieved through thermal bonding performance on quartz substrate microchips which are fabricated by the pre-bonding method proposed in this disclosure. The effect picture can be referred to FIG. 3.

What is claimed is:

1. A plasma-assisted method of accurate alignment and pre-bonding for a microstructure including a glass or quartz chip, the method comprising sequential steps of:
   a) removing superficial photoresist and chromium layers of substrate and cover plates of glass or quartz microchips after wet etching;
   b) washing the substrate and cover plates using a detergent and then water to remove superficial organics, solid particles, and dust;
   c) blowing majority of the water away from the substrate and cover plates and then performing a rinse and activation using a plasma cleaning device to make the substrate and cover plates to be hydrophily;
   d) obtaining the rinsed and activated subtract and cover plates and then sticking the rinsed and activated subtract and cover plates, thereby performing a preliminary alignment; wherein the performing the preliminary alignment comprises performing the preliminary alignment using naked eyes;
   e) performing an accurate alignment on the rinsed and activated subtract and cover plates under a drying condition and then placing water into an edge of a gap between the subtract and cover plates to form a hydrophilic layer between surfaces of the subtract and cover plates and to make the subtract and cover plates stick tightly to each other; wherein the performing the accurate alignment comprises performing the accurate alignment under a microscope;
   f) removing extra water from the subtract and cover plates by pressing the subtract and cover plates and then blowing water away from the edge; and g) removing remaining water from the subtract and cover plates by vacuuming using the plasma cleaning device to obtain pre-bonded glass or quartz chips.

2. The method of claim 1, wherein materials of the substrate plates in step a) comprise glass or quartz materials.

3. The method of claim 1, wherein the performing the rinse and activation in step c) comprises performing the rinse and activation for 3-10 minutes and gas for stimulating plasma of the plasma cleaning device comprises air, nitrogen or oxygen.

4. The method of claim 1, wherein the placing the water into the edge of the gap comprises placing water on the edge of the gap using 2-7 μL water such that the water enters the gap via capillary penetration after the performing the accurate alignment in step e).

5. The method of claim 1, wherein the blowing the water away comprises blowing the water away using a high-pressure air gun.

6. The method of claim 1, wherein the vacuuming using the plasma cleaning device in step g) comprises vacuuming for 5-20 minutes using the plasma cleaning device.

7. The method of claim 6, wherein the accurate alignment and pre-bonding are performed within 20-35 minutes.

8. The method of claim 6, Further comprising: performing a thermal bonding method on the pre-bonded glass or quartz chips by placing the pre-bonded glass or quartz chips into a muffle furnace and heating the pre-bonded glass or quartz chips based on a predetermined heating procedure to obtain permanent bonded glass or quartz chips.

9. The method of claim 8, wherein a rate of the predetermined heating procedure is 1-3° C. per minute, an initial temperature of the predetermined heating procedure is a room temperature, the maximum temperature of the predetermined heating procedure is 550° C.-1200° C., a temperature holding time of the predetermined heating procedure is 1-3 hours, a cooling rate of the predetermined heating procedure is 0.5-5.5° C. per minute, and a final temperature of the predetermined heating procedure is the room temperature.

* * * * *